United States Patent
Jeon

(10) Patent No.: US 10,893,606 B2
(45) Date of Patent: Jan. 12, 2021

(54) DISPLAY DEVICE INCLUDING CUTOUT PORTION AT FOLDING AXIS

(71) Applicant: SAMSUNG DISPLAY CO., LTD., Yongin-si (KR)

(72) Inventor: Heechul Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 17 days.

(21) Appl. No.: 16/291,015

(22) Filed: Mar. 4, 2019

(65) Prior Publication Data

US 2019/0281692 A1 Sep. 12, 2019

(30) Foreign Application Priority Data

Mar. 6, 2018 (KR) .................. 10-2018-0026239

(51) Int. Cl.
*H05K 1/00* (2006.01)
*H05K 1/02* (2006.01)
(Continued)

(52) U.S. Cl.
CPC ......... *H05K 1/028* (2013.01); *H01L 27/3276* (2013.01); *H01L 51/0097* (2013.01); *H01L 51/5281* (2013.01); *H05K 1/0296* (2013.01); *H05K 1/111* (2013.01); *H05K 1/118* (2013.01); *H05K 1/147* (2013.01); *G02F 1/13452* (2013.01); *G02F 1/133305* (2013.01); *G02F 1/133528* (2013.01); *H01L 2251/5338* (2013.01); *H05K 2201/10128* (2013.01); *H05K 2201/10136* (2013.01)

(58) Field of Classification Search
CPC ........ H05K 1/028; H05K 1/147; H05K 1/118; H05K 1/0296; H05K 1/111; H05K 2201/10136; H05K 2201/10128; H05K 1/148; H05K 1/189; H05K 2201/09063; H01L 51/5281; H01L 51/0097; H01L 27/3276; H01L 2251/5338; G02F 1/133528; G02F 1/133305; G02F 1/13452
See application file for complete search history.

(56) References Cited

U.S. PATENT DOCUMENTS 9,379,355 B1 * 6/2016 Lee ........................... B32B 5/18
9,430,180 B2 * 8/2016 Hirakata ............... G06F 3/0412
(Continued)

FOREIGN PATENT DOCUMENTS

KR 1020160090980 A 8/2016
KR 101697972 B1 1/2017
(Continued)

*Primary Examiner* — Yuriy Semenenko
(74) *Attorney, Agent, or Firm* — Cantor Colburn LLP

(57) ABSTRACT

A display device includes: a display panel including: a substrate foldable about a folding axis of the display device, and a pad portion provided in plurality including a first pad portion and a second pad portion respectively disposed at opposing sides of the folding axis; and a flexible printed circuit film commonly attached to the first pad portion and the second pad portion of the display panel. The flexible printed circuit film commonly attached to the first and second pad portions of the display panel defines a cut-out portion of the flexible printed circuit film which is located on an extension line of the folding axis of the display device.

22 Claims, 11 Drawing Sheets

(51) Int. Cl.
*H05K 1/11* (2006.01)
*H01L 27/32* (2006.01)
*H05K 1/14* (2006.01)
*H01L 51/00* (2006.01)
*H01L 51/52* (2006.01)
*G02F 1/1345* (2006.01)
*G02F 1/1333* (2006.01)
*G02F 1/1335* (2006.01)

(56) References Cited

U.S. PATENT DOCUMENTS

| | | | |
|---|---|---|---|
| 9,888,582 B2 | 2/2018 | Jo et al. | |
| 2002/0008682 A1* | 1/2002 | Park | G09G 3/20 |
| | | | 345/87 |
| 2005/0045882 A1* | 3/2005 | Park | H01L 27/3248 |
| | | | 257/59 |
| 2011/0115731 A1* | 5/2011 | Kuwajima | G06F 3/041 |
| | | | 345/173 |
| 2011/0285607 A1* | 11/2011 | Kim | G06F 3/041 |
| | | | 345/1.3 |
| 2014/0217373 A1* | 8/2014 | Youn | H01L 51/5203 |
| | | | 257/40 |
| 2015/0001497 A1* | 1/2015 | Jung | H01L 51/0097 |
| | | | 257/40 |
| 2015/0091434 A1* | 4/2015 | Kim | H01L 51/0097 |
| | | | 313/504 |
| 2016/0219706 A1* | 7/2016 | Jo | H05K 3/361 |
| 2016/0308151 A1* | 10/2016 | Kim | H01L 51/5253 |
| 2017/0162821 A1* | 6/2017 | Oh | H01L 51/5256 |
| 2017/0194409 A1* | 7/2017 | Jeong | H01L 27/3248 |
| 2017/0278918 A1 | 9/2017 | Jeon | |
| 2018/0212169 A1* | 7/2018 | Goto | H01L 51/5253 |

FOREIGN PATENT DOCUMENTS

| | | |
|---|---|---|
| KR | 1020170079993 A | 7/2017 |
| KR | 1020170113870 A | 10/2017 |
| KR | 1020170125186 A | 11/2017 |

* cited by examiner

DISPLAY DEVICE INCLUDING CUTOUT PORTION AT FOLDING AXIS

This application claims priority to Korean Patent Application No. 10-2018-0026239, filed on Mar. 6, 2018, and all the benefits accruing therefrom under 35 U.S.C. § 119, the disclosure of which is incorporated by reference herein in its entirety.

BACKGROUND

1. Field

One or more embodiment of the invention relates to a display device, and more particularly, to a display device having a cut-out portion along a folding axis in at least one of a substrate and a flexible printed circuit board of the display device.

2. Description of the Related Art

Display devices may be classified into liquid crystal display ("LCD") devices, organic light emitting diode ("OLED") display devices, plasma display panel ("PDP") devices, electrophoretic display devices, or the like based on a light emitting scheme thereof.

Display devices are manufactured by forming a plurality of layers and elements on a substrate. Glass is used to form the substrate of the display device. However, the glass substrate is relatively heavy and prone to breakage.

In addition, since the glass substrate is relatively rigid, it is difficult to transform the display device such as deforming a shape thereof by folding, bending, etc. Display devices using a flexible substrate that is relatively light, strong against impact and easy to transform are being developed.

SUMMARY

One or more embodiment of the invention may be directed to a display device including a flexible substrate that is improved in terms of the reliability of a bending area and a pad area of the display device by reducing or substantially preventing disconnection of wirings at the bending and/or pad area which may occur upon folding.

According to an embodiment, a display device includes: a display panel which receives a signal to display an image, the display panel including: a substrate foldable about a folding axis of the display device, and a pad portion which is on the substrate, at which the signal is provided to the display panel from outside thereof, the pad portion provided in plurality including a first pad portion and a second pad portion respectively disposed at opposing sides of the folding axis; and a flexible printed circuit film through which the signal is provided to the display panel from the outside thereof, the flexible printed circuit film commonly attached to the first pad portion and the second pad portion of the display panel. The flexible printed circuit film commonly attached to the first pad portion and the second pad portion of the display panel defines a cut-out portion of the flexible printed circuit film which is located on an extension line of the folding axis of the display device.

The flexible printed circuit film may include a pad area at which the flexible printed circuit film is attached to the pad portion of the display panel, and the display panel may define a cut-out portion thereof located on the extension line of the folding axis of the display device, the cut-out portion of the display panel overlapping the cut-out portion of the flexible printed circuit film at the pad area thereof.

From the pad area at which the cut-out portions of the display panel and the flexible printed circuit film overlap each other, the cut-out portion of the display panel may extend further than an edge of the flexible printed circuit film to dispose a portion of the cut-out portion of the display panel non-overlapping with the flexible printed circuit film, and the cut-out portion of the flexible printed circuit film may extend further than an edge of the display panel to dispose a portion of the cut-out portion of the flexible printed circuit film non-overlapping with the display panel.

The display device may further in include a driving circuit chip which provides the signal to the flexible printed circuit film, mounted on the flexible printed circuit film. The flexible printed circuit film may include: a first flexible printed circuit portion including wiring connecting the driving circuit chip to the first pad portion of the display panel; a second flexible printed circuit portion including wiring connecting the driving circuit chip to the second pad portion of the display panel; and a connection portion connecting the first flexible printed circuit portion and the second flexible printed circuit portion to each other, the connection portion defining the cut-out portion of the flexible printed circuit film together with the first flexible printed circuit portion and the second flexible printed circuit portion.

The display panel may further include a display area at which an image is displayed and a non-display area which is adjacent to the display area and at which the image is not displayed. In the non-display area, the first pad portion and second pad portion of the display panel may be respectively disposed at the opposing sides of the folding axis of the display device, and the cut-out portion of the flexible printed circuit film may lengthwise extend along the extension line of the folding axis of the display device.

The display panel may further include a bending area at which the display panel is bendable along a bending axis intersecting the folding axis of the display device, and along a length of the folding axis, the bending area of the display panel may be respectively between the display area and each of the first and second pad portions of the display panel.

Along the length of the folding axis, a length of the cut-out portion of the display panel may extend from the pad portion and into the bending area.

The display panel may further include: along the length of the folding axis, a fan-out portion between the bending area and the pad portion, the fan-out portion provided in plurality including a first fan-out portion and a second fan-out portion respectively disposed at the opposing sides of the folding axis, and wirings on the substrate, extended from the display area and through the fan-out area to the pad portion, and through which the signal is provided to the display area from the pad portion. An interval between the wirings of the display panel in the fan-out portion may be smaller than that in the bending area. A length of the cut-out portion of the display panel may extend along the length of the folding axis to be disposed between the first fan-out portion and the second fan-out portion.

Along a length of the folding axis of the display device, an end portion of the cut-out portion of the display panel may be disposed furthest from the flexible printed circuit film, and the end portion may have a planar shape among a wedge shape, a polygonal shape, a circular shape, and an elliptical shape on a plane.

The cut-out portion of the display panel and the cut-out portion of the flexible printed circuit film may be defined through a thickness of the display panel and a thickness of the flexible printed circuit film, respectively.

The display device may further include a polarizing plate disposed on the display panel. The polarizing plate may define a cut-out portion thereof overlapping the cut-out portion of the display panel.

According to an embodiment, a display device includes: a display panel which receives a signal to display an image, the display panel including a substrate foldable about a folding axis of the display device and a pad portion which is on the substrate, at which the signal is provided to the display panel from outside thereof, the pad portion provided in plurality including a first pad portion and a second pad portion respectively disposed at opposing sides of the folding axis; a flexible printed circuit film through which the signal is provided to the display panel from the outside thereof, the flexible printed circuit film commonly attached to the first pad portion and the second pad portion of the display panel; and a driving circuit chip which provides the signal to the flexible printed circuit film and is mounted on the flexible printed circuit film. The driving circuit chip is disposed apart from a central portion of the flexible printed circuit film commonly attached to the first pad portion and the second pad portion of the display panel.

The driving circuit chip may not overlap the folding axis.

At least one of the substrate and the flexible printed circuit film may define a cut-out portion located on an extension line of the folding axis.

The flexible printed circuit film may include: a first flexible printed circuit portion including wiring connecting the driving circuit chip to the first pad portion of the display panel; a second flexible printed circuit portion including wiring connecting the driving circuit chip to the second pad portion of the display panel; and a connection portion connecting the first flexible printed circuit portion and the second flexible printed circuit portion to each other, the connection portion defining the cut-out portion of the flexible printed circuit film together with the first flexible printed circuit portion and the second flexible printed circuit portion.

The driving circuit chip may be mounted on one of the first flexible printed circuit portion and the second flexible printed circuit portion.

Among the first and second flexible printed circuit portions, a width of the wiring of the one flexible printed circuit portion on which the driving circuit chip mounted is smaller than a width of the wiring of the other flexible printed circuit portion.

The wiring of the one flexible printed circuit portion on which the driving circuit chip mounted has may have a zigzag shape.

The connection portion of the flexible printed circuit film may include wirings connected to one of the first pad portion and the second pad portion of the display panel, and the wirings of the connection portion may be disposed in different layers of the flexible printed circuit film at the connection portion thereof, to overlap each other.

The display panel may further include a bending area at which the display panel is bendable along a bending axis intersecting the folding axis of the display device, and along a length of the folding axis, the bending area of the display panel may be respectively between the display area and each of the first and second pad portions.

The cut-out portion of the display panel may extend from the pad portion and into the bending area.

The display device may further include a polarizing plate disposed on the display panel. The polarizing plate may define a cut-out portion overlapping the cut-out portion of the display panel.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, where.

DETAILED DESCRIPTION

Figure 1:
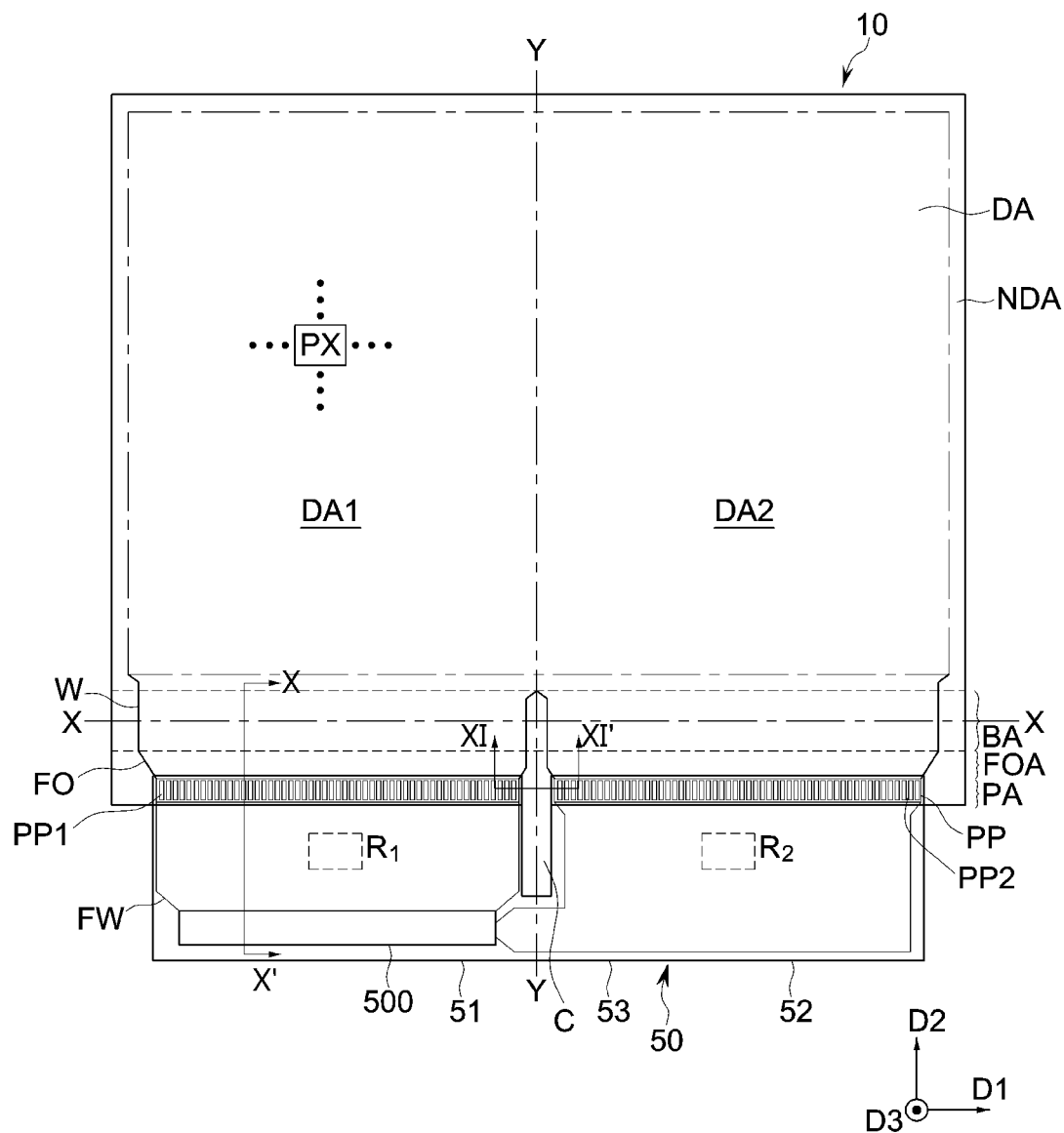
FIG. 1 is a top plan view schematically illustrating an embodiment a display device in a flat state according to the invention.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being related to another element such as being "on" another layer, area, or plate, it may be directly on the other layer, area, or plate, or intervening layers, areas, or plates may be present therebetween. Conversely, when a layer, area, or plate is referred to as being related to another element such as being "directly on" another layer, area, or plate, intervening layers, areas, or plates are absent therebetween. Further when a layer, area, or plate is referred to as being related to another element such as being "below" another layer, area, or plate, it may be directly below the other layer, area, or plate, or intervening layers, areas, or plates may be present therebetween. Conversely, when a layer, area, or plate is referred to as being related to another element such as being "directly below" another layer, area, or plate, intervening layers, areas, or plates are absent therebetween.

The spatially relative terms "below," "beneath," "lower," "above," "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the casing where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "mechanically connected" or "physically connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the invention and like reference numerals refer to like elements throughout the specification.

Display devices using a flexible substrate may be designed to be bendable at an edge portion thereof or the like which includes a terminal pad portion to which a flexible printed circuit ("FPC") film for transmitting signals is attached or to be foldable by dividing a display area, thereby reducing a dead space as compared to a conventional display device using a relatively hard substrate. By reducing the dead space within a display device, a bezel width of the display device may be reduced and the utilization of the internal space of the display device may be enhanced, and thus the display device may be designed more compact.

Figure 2:
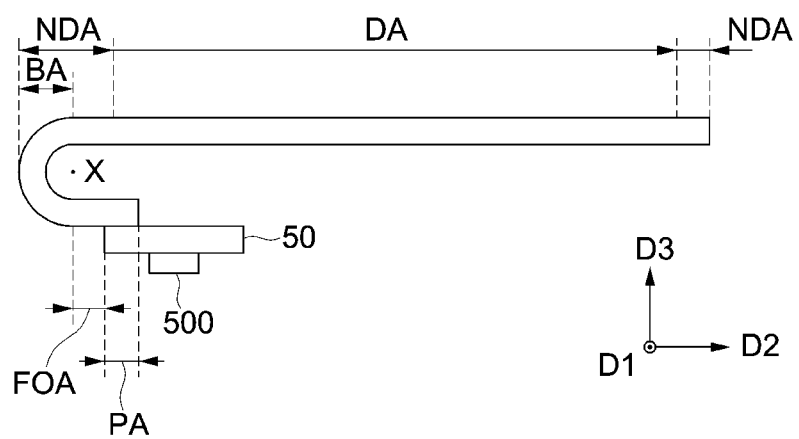
FIG. 2 is a cross-sectional side view of the display device illustrated in FIG. 1 in a bent state according to the invention.
Figure 3:
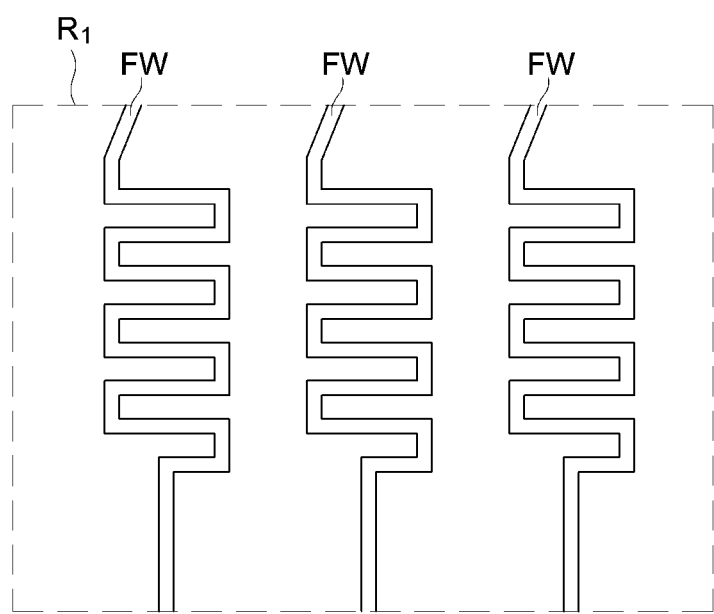
FIG. 3 is a top plan view illustrating an embodiment of conductive wirings in an area R1 of a flexible printed circuit ("FPC") film of the display device in FIG. 1 according to the invention.
Figure 4:
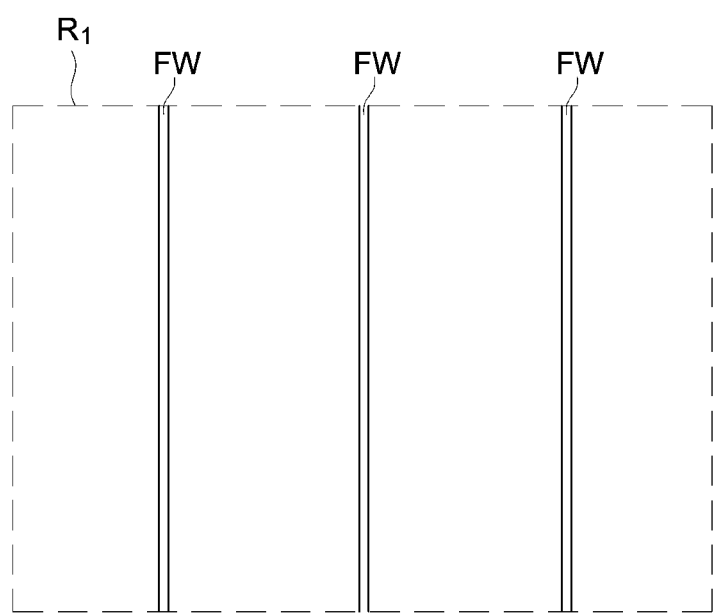
FIG. 4 is a top plan view illustrating another embodiment of conductive wirings in the area R1 of the FPC film of the display device in FIG. 1 according to the invention.
Figure 5:
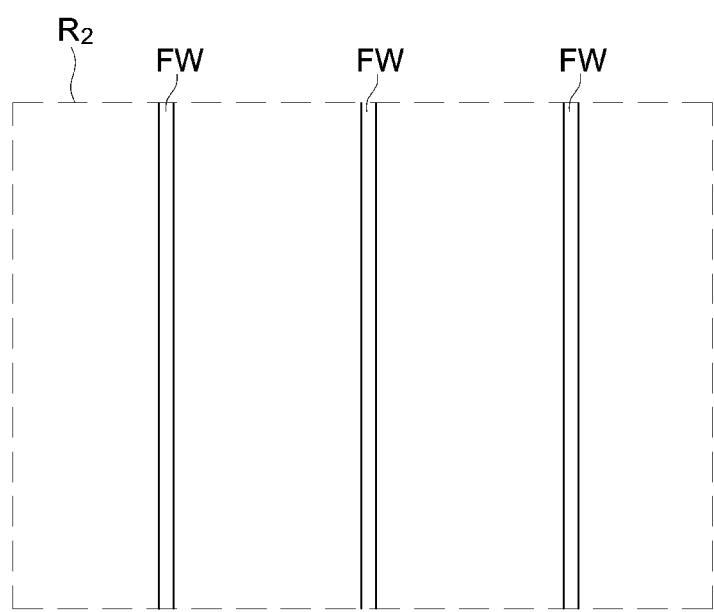
FIG. 5 is a top plan view illustrating conductive wirings in an area R2 of the FPC film of the display device in FIG. 1 according to the invention.

FIG. 1 is a top plan view schematically illustrating an embodiment of a display device in a flat state according to the invention, FIG. 2 is a cross-sectional side view of the display device illustrated in FIG. 1 in a bent state according to the invention, FIG. 3 is a top plan view illustrating an embodiment of conductive wirings FW disposed in an area R1 of a flexible printed circuit ("FPC") film of the display device in FIG. 1 according to the invention, FIG. 4 is a top plan view illustrating another embodiment of conductive wirings disposed in the area R1 of the FPC film of the display device in FIG. 1 according to the invention, and FIG. 5 is a top plan view illustrating an embodiment of conductive wirings FW disposed in an area R2 of the FPC film of the display device in FIG. 1.

Referring to FIGS. 1 and 2, the display device according to an embodiment of the invention includes a display panel 10 and an FPC film 50 which is connected to the display panel 10. The display panel 10 may display an image such as with light generated within the display panel 10 or with light provided from outside the display panel 10 within the overall display device. The FPC film 50 may be a component external to the display panel 10 and connected thereto. In addition, the display device according to an embodiment of the invention may further include a polarizing plate (not shown) disposed on at least one surface of the display panel 10.

The display panel 10 includes a display area DA for displaying images, and a non-display area NDA which is disposed around the display area DA and at which images are not displayed. In the non-display area NDA, conductive elements and/or wirings W for generating and/or transmitting various signals applied to the display area DA are disposed. The signals may include driving signals, control signals, power signals, data signals, etc. without being limited thereto.

In the display area DA of the display panel 10, a pixel PX is provided in plurality such as arranged in a matrix form, for example. The pixel PX is controlled or driven to generate light and/or display an image. The pixel PX may receive and/or transmit various signals to generate the light and/or display the image. In addition, signal lines such as a gate line (not shown) and a data line (not shown) are also disposed in the display area DA, such as in a plurality thereof. The signal lines in the display area DA may extend to the non-display area NDA and may terminate at or in the non-display area NDA without being limited thereto. The extended signal lines of the display area DA may be connected to terminal pads of the display panel 10.

In an embodiment, the gate lines may lengthwise extend substantially in a first direction D1 (e.g., a row direction), and the data lines may lengthwise extend substantially in a second direction D2 (e.g., a column direction) which intersects the first direction D1. The gate lines may lengthwise extend in the substantially same direction as the data lines, for example, in the second direction D2. The display device and elements thereof in a flat state are disposed in a plane defined by two directions crossing each other, e.g., the first and second directions D1 and D2.

Each pixel PX may be connected to a gate line and a data line, and may receive a gate signal and a data signal from the signal lines, respectively. In the case of organic light emitting diode ("OLED") display devices, driving voltage lines (not shown) for transmitting driving voltage to the pixels PX may be disposed in the display area DA and substantially lengthwise extend in, e.g., the second direction D2.

The display panel 10 may be foldable along a folding axis Y. In FIG. 1, the folding axis Y lengthwise extends along the second direction D2. The folding axis Y may be disposed at a central portion of the display area DA along the first direction D1.

When the display panel 10 is folded along the folding axis Y, the display area DA may be divided into a first display area DA1 and a second display area DA2 to display different images therein, respectively.

Referring to FIG. 1, the display panel 10 is depicted as having one folding axis Y. However, embodiments are not limited thereto, and the display panel 10 may have two or more folding axes.

The non-display area NDA of the display panel 10 includes a pad area PA in which a pad portion PP is disposed at which signals from outside the display panel 10 are received. The overall pad portion PP may include a first pad portion PP1 and a second pad portion PP2 for receiving signals from the outside of the display panel 10. Each of the first pad portion PP1 and the second pad portion PP2 includes (terminal) pads (not shown) arranged at predetermined intervals along, for example, the first direction D1. The first pad portion PP1 and the second pad portion PP2 are disposed at a predetermined interval along the first direction D1 at an edge portion or end portion of the display panel 10.

The display panel 10 may have a cut-out portion C defined between the first pad portion PP1 and the second pad portion PP2. Specifically, in the flat (e.g., unbent) state of the display panel 10, the cut-out portion C is defined lengthwise substantially in the second direction D2 from an edge of the display panel 10 toward the display area DA thereof. The cut-out portion C may be located on a virtual extension line of the folding axis Y along which the display panel 10 is folded. The cut-out portion C may be defined through or extend into a portion of a thickness the display panel 10 substantially in a third direction D3 which is the thickness direction of the display panel 10. The third direction D3 crosses each of the first and second directions D1 and D2, such as being orthogonal to the first and second directions D1 and D2 without being limited thereto.

In addition, the cut-out portion C may extend from between the first pad portion PP1 and the second pad portion PP2 through a bending area BA of the display panel 10 at which the display panel 10 (and the display device) is bendable. That is, the cut-out portion C may extend to the starting point of the bending area BA of the display panel 10 which is a location of the bending area BA closest to the display area DA.

Due to the cut-out portion C, the first pad portion PP1 and the second pad portion PP2 are disconnected from each other in the first direction D1, while each being disposed at the pad area PA of the display panel 10. Accordingly, even when the display panel 10 is folded along the folding axis Y, interference between the first pad portion PP1 and the second pad portion PP2 may be alleviated or suppressed. The alleviated or suppressed interference makes it possible to reduce or effectively prevent the stress generated in elements or layers of the display device when the display panel 10 is folded along the folding axis Y from affecting the wirings W of the display panel disposed in the bending area BA.

In an exemplary embodiment of manufacturing a display device, the cut-out portion C may be defined by cutting or removing a portion of the display panel 10 such as by using a laser or a knife or by etching elements or layers the display panel 10 through photolithography.

The first pad portion PP1 and the second pad portion PP2 are connected to a first end of the FPC film 50, such as a same first end of a single one FPC film 50. That is, the same one FPC film 50 may be commonly connected to each of the first pad portion PP1 and the second pad portion PP2 of the display panel 10. Along a thickness direction, an anisotropic conductive film (not shown) is placed between the FPC film 50 and each of the first pad portion PP1 and the second pad portion PP2 to connect the FPC film 50 respectively to the first pad portion PP1 and the second pad portion PP2. A second end of the FPC film 50 which is opposite to the first end thereof may be connected to, e.g., a printed circuit board ("PCB") (not shown), to transmit signals such as a control signal or image data between the display panel 10 and the PCB. The PCB may be disposed external relative to the display panel 10 provide and/or receive signals and/or data to and/or from the display panel 10.

A driving device for generating and/or processing various signals for driving the display panel 10 may be disposed at the non-display area NDA of the display panel 10 or the FPC film 50, or at the PCB which may be external to both the display panel 10 and the FPC film 50 without being limited thereto. The driving device may include a data driver from which the data signal is applied to the data line of the display panel 10, a gate driver from which the gate signal is applied to the gate line of the display panel 10, and/or a signal controller for controlling the data driver and the gate driver.

The data driver is mounted on the FPC film 50 in the form of a driving circuit chip 500 and is connected to the pad portion in the form of a tape carrier package.

The FPC film 50 includes a first FPC portion 51 including wirings connected to the first pad portion PP1, a second FPC portion 52 including wirings connected to the second pad portion PP2, and a connection portion 53 defining an opening in the FPC film 50 together with the first FPC portion 51 and the second FPC portion 52. The opening defined in the FPC film 50 corresponds or is aligned with the cut-out portion C of the display panel 10. The opening defined in the FPC film 50 may hereinafter be referred to as a cut-out portion C of the FPC film 50).

The driving circuit chip 500 is disposed corresponding to one of the first pad portion PP1 and the second pad portion PP2, while being spaced apart from a central portion of the FPC film 50 located on the virtual extension line of the folding axis Y defined for the display panel 10.

Referring to FIGS. 1 and 2, the driving circuit chip 500 is connected to a wiring FW provided in plurality of the FPC film 50. The wiring FW may be disposed on a base substrate of the FPC film 50. The wirings FW of the FPC film 50 are connected to the driving circuit chip 500 at a first end of the wirings FW, and connected to the first pad portion PP1 and the second pad portion PP2 at a second end of the wirings FW opposite to the first end thereof. The first ends of the wiring FW may be extended from a same driving circuit chip 500. The second ends of the wirings FW may be disposed in a pad area of the FPC film 50 which corresponds to the pad area PA of the display panel 10 and at which the FPC film 50 is connected to the display panel 10. Similarly to the display panel 10, the FPC film 50 may include terminal pads (not shown) on a base substrate of the FPC film 50, without being limited thereto.

Since the driving circuit chip 500 is located spaced apart or away from the central portion of the FPC film 500, the distance between the driving circuit chip 500 and the first pad portion PP1 is less than the distance between the driving circuit chip 500 and the second pad portion PP2. Accordingly, the wirings FW disposed at the FPC film 50 are designed to have a substantially equal electrical resistance in consideration of the difference in electrical resistance value of the wirings FW which are defined by the differences in the distance.

The first FPC portion 51 includes the wirings FW connected to the first pad portion PP1. In addition, the second FPC portion 52 includes the wirings FW connected to the second pad portion PP2.

The wirings FW may have a length dimension which is larger than a width dimension. The width dimension of the wiring FW may be taken in a direction perpendicular to the length dimension of the wiring FW at a location along the length dimension. Referring to FIGS. 1, 3, 4 and 5, the wirings FW represented at an area R1 of the first FPC portion 51 (FIGS. 3 and 4) have a width less than a width of the wirings FW represented at an area R2 of the second FPC portion 52 (FIG. 5). The wirings FW at the area R1 may have a zig-zag shape along the length of the wirings FW (FIG. 3), so that an electrical resistance thereof substantially equal to an electrical resistance of the wirings FW of the second FPC portion 52 (FIG. 5).

The connection portion 53 includes a portion of the wiring FW connected to each of the driving circuit chip 500 and the second pad portion PP2. The connection portion 53 of the FPC film 50 may be folded about the folding axis Y together with the display panel 10. Since the wirings FW disposed at the connection portion 53 are arranged in an overall narrower planar area (e.g., product of D1-dimension and D2-dimension of FPC film 50 at the connection portion 53) than a planar area of the wirings connected to the first pad portion PP1, the wirings FW of the connection portion 53 may be insulated from each other and disposed on different layers along a thickness of the FPC film 50. That is, the wirings FW disposed at the connection portion 53 may be disposed overlapping each other along the thickness direction of the FPC film 50.

The opening of the FPC film 50 is disposed overlapping the cut-out portion C of the display panel 10 in the pad area PA of the display panel 10. The cut-out portions C of the display panel 10 and the FPC film 50 may be aligned with each other to form an overall cut-out portion C of the display device. At least a portion of the cut portion of the display panel 10 and at least a portion of the cut-out portion of the FPC film 50 do not overlap each other. Referring to the top plan view of FIG. 1, a lower edge of the display panel 10 is disposed overlapping an upper portion of the FPC film 50, while an upper edge of the FPC film 50 is disposed overlapping the non-display area NDA at the bottom of the display panel 10.

In an embodiment, the cut-out portion C of the display panel 10 extends recessed from a virtual line extended from the lower edge of the display panel 10, in the second direction D2, for a predetermined distance in the second direction D2. The cut-out portion C of the display panel 10 may be open in a direction opposite to the second direction D2 indicated in FIG. 1, at the lower edge of the display panel 10, without being limited thereto. The cut-out portion C of the FPC film 50 extends recessed from a virtual line extended from the upper edge of the FPC film 50, in the direction opposite to the second direction D2 indicated in FIG. 1, for a predetermined distance in the direction opposite to the second direction D2. The cut-out portion C of the FPC film 50 may be open in the second direction D2 indicated in FIG. 1, at the upper edge of the FPC film 50, without being limited thereto.

When the pad area PA of the display panel 10 and the pad area of the FPC film 50 are overlapped with each other, the cut-out portions C of the display panel 10 and the FPC film 50 form a closed overall shape of a cut-portion of the display device in the top plan view. More particularly, at a portion of the pad area PA of the display panel 10 corresponding to the pad area of the FPC film 50, the respective cut-out portions overlap each other. The respective cut-out portions extend from the overlapped area, in directions opposite to each other to form the closed overall shape of the cut-out portion of the display device. That is, the cut-out portion C defined in the FPC film 50 extends further in the direction opposite to the second direction D2 indicated in FIG. 1 to be disposed at a position not overlapping the display panel 10. Conversely, the cut-out portion C defined in the display panel 10 extends further in the second direction D2 indicated in FIG. 1 to be disposed at a position not overlapping the FPC film 50.

The gate driver (not shown) may be integrated in a non-display area NDA at left and/or right edges of the display panel 10 and may be provided in the form of an integrated circuit ("IC") chip. A signal control unit and/or the gate driver may be mounted on the PCB in the form of an IC chip to transmit control signals to and through the FPC film 50 to the display panel 10, or may be formed into the driving circuit chip 500 along with the data driver.

The display panel 10 includes the bending area BA between the display area DA and the pad area PA and at which the display panel 10 is bendable. The bending area BA is lengthwise extended across the display panel 10 in the first direction D1. A portion of the display panel 10 may be bent with respect to a bending axis X parallel to the first direction D1. The bent display panel 10 may dispose the FPC film 50, for example, at the back of the display area DA, as illustrated in FIG. 2. An entirety of the bending area BA may be disposed in the non-display area NDA, without being limited thereto. Dissimilar to the illustrated exemplary embodiment, the bending area BA which lengthwise extends along a direction crossing the direction of the folding axis Y may be disposed in both the display area DA and the non-display area NDA, or may be located only in the display area DA.

A fan-out area FOA is located between the bending area BA and the pad area PA along the second direction D2. The fan-out area FOA may be lengthwise extended across the display panel 10 in the first direction D1. Each of the bending area BA, the fan-out area FOA and the pad area PA may include an entirety of the dimension of the display panel 10 along the first direction D1, taken along a dimension of the display panel 10 along the second direction D2. In a flat state of the display panel 10, the non-display area NDA at the end portion at which the FPC film 50 is attached may include an entirety of the display panel 10 from the display area DA to a distal end of the display panel 10 defined at the pad area PA thereof, that is, a total dimension in the second direction D2 of the bending area BA, fan-out area FOA and the pad area PA without being limited thereto.

The fan-out area FOA includes a fan-out (wiring) portion FO provided in plurality, where the wirings W of the display panel 10 which are connected to the pads of the first pad portion PP1 and the second pad portion PP2 thereof are located. Two groups of fan-out portions FO may be respectively disposed corresponding to the first pad portion PP1 and the second pad portion PP2 such that the groups are considered adjacent to each other. Similar to the first pad portion PP1 and the second pad portion PP2, the fan-out portions FO are arranged at predetermined intervals along the first direction D1. The interval between adjacent fan-out portions FO may be gradually narrowed as the distance from the first pad portion PP1 and the second pad portion PP2 in the second direction D2 increases.

The wirings W may extend from the pad area PA in the non-display area NDA, through the fan-out area FOA and the bending area BA, and are connected to various signal lines such as the data lines disposed in the display area DA. In a flat state of the display panel 10, the wirings W lengthwise extend in the second direction D2 in the bending area BA, and thus extend perpendicularly to the bending axis X.

Referring to FIG. 1, the cut-out portion C of the display panel 10 defined in the pad area PA may lengthwise extend through the area between adjacent fan-out portions FO of the fan-out area FOA and through the bending area BA. Accordingly, when the first pad portion PP1, the second pad portion PP2 and the display panel 10 are folded along the folding axis Y, the stress generated between the first pad portion PP1 and the second pad portion PP2 may be substantially prevented from affecting pad terminals and circuit wirings due to the cut-out portion C.

Since the cut-out portion C is defined between the first pad portion PP1 and the second pad portion PP2 in the pad area PA of the display panel 10, between adjacent fan-out portions FO in the bending area BA of the display panel 10, and in the FPC film 50, the wirings W of the display panel 10 and the wirings FW of the FPC film 50 are not located in the area where the cut-out portions C are defined.

A polarizing plate (not shown) is located on at least one surface of the display panel 10 and is folded along the folding axis Y together with the display panel 10. The polarizing plate overlaps at least a portion of the bending area BA located between the display area DA of the display panel 10 and the pad area PA. In an embodiment, the polarizing plate may overlap a portion of the pad area PA, but may not overlap the entire pad area PA to expose a portion of the pad area PA. In addition, the polarizing plate may have a cut-out portion overlapping the cut-out portion C of the display panel 10.

As illustrated in the top plan view of FIG. 1, the cut-out portion C defined in the display panel 10 and the polarizing plate may each have a wedge shape or a V-shape that has a width along the first direction D1 which is decreases along the second direction D2 from an edge or distal end of the display panel 10 (e.g., at the pad area PA) toward the display area DA. However, embodiments are not limited thereto, and the cut-out portion C may be defined in a rectangular planar shape having a constant width along the second direction D2. In addition, the cut-out portion C may have a constant width, but an end portion of the cut-out portion C closest to the display area DA may have a rounded shape, or may have a circular, semicircular or semi-elliptical planar shape. The cut-out portion C may have a planar shape similar to that of an electric light bulb.

The overall configuration of the display device has been described so far. Features related to the cut-out portion C defined in one or more element of the display device according to the invention will now be described with reference to FIGS. 6 and 7.

Figure 6:
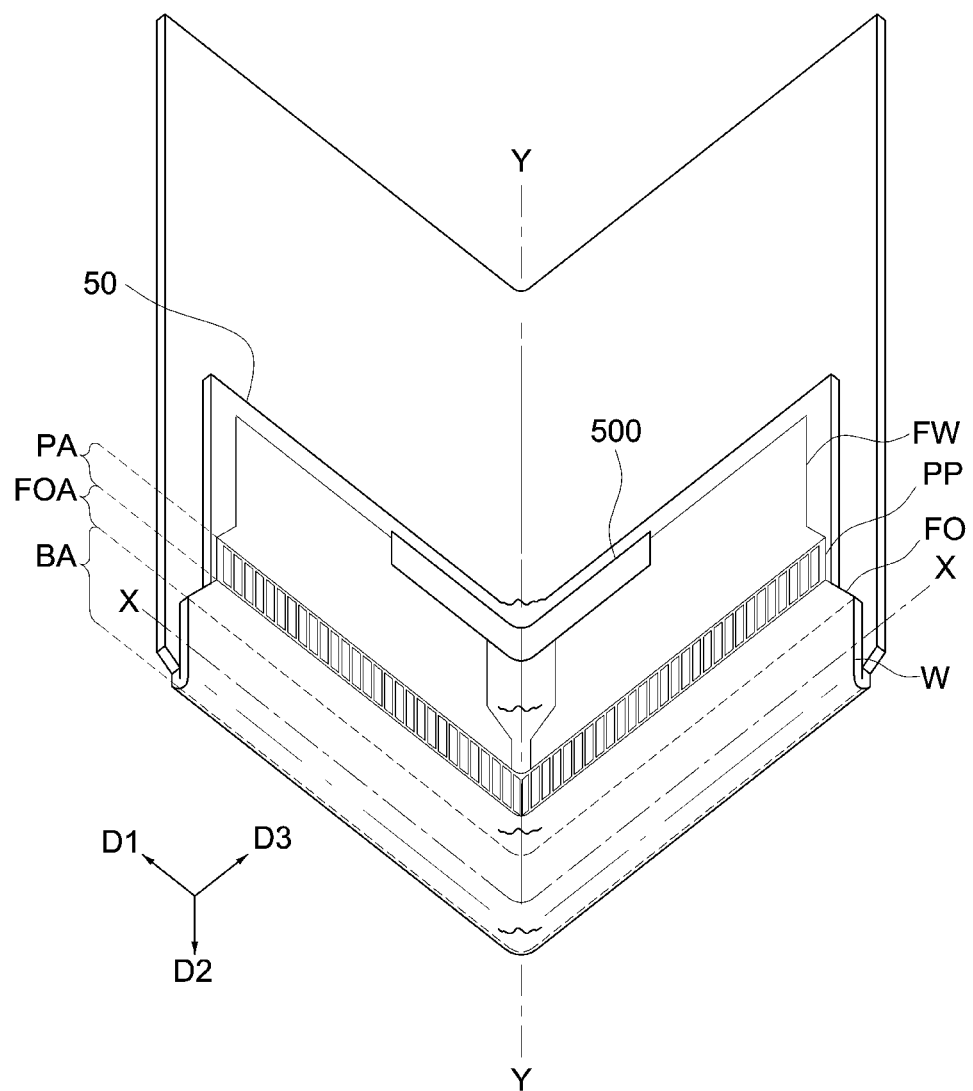
FIG. 6 is a perspective view illustrating a display device which has no cut-out portion and is folded along a folding axis.
Figure 7:
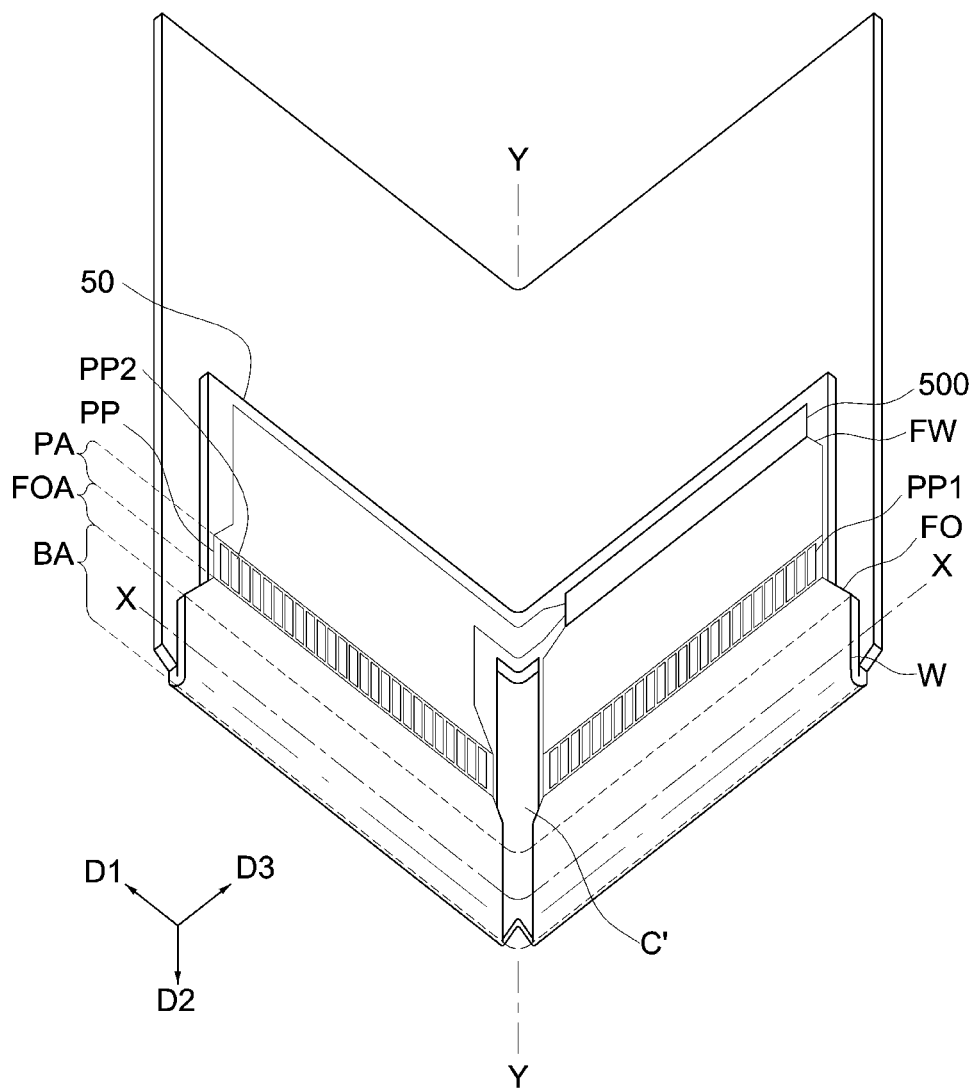
FIG. 7 is a perspective view illustrating an embodiment of a display device which has a cut-out portion and is folded along a folding axis according to the invention.

FIG. 6 is a perspective view illustrating a display device which has no cut-out portion and is folded along a folding axis Y, and FIG. 7 is a perspective view illustrating an embodiment of a display device which has a cut-out portion and is folded along the folding axis Y according to the invention.

There is shown in FIG. 6 an example in which a display device includes no cut-out portion defined within the pad portion PP such as to separate adjacent portions thereof from each other (refer to PP1 and PP2 in FIG. 1). Even if the FPC film 50 is considered attached to a first pad portion at one side of the folding axis Y and a second pad portion at an opposing side of the folding axis Y, the driving circuit chip 500 is mounted at the center of the FPC film 50, e.g., to the pad portion PP at the folding axis Y.

In the case where the driving circuit chip 500 is disposed at the center of the FPC film 50, in the process of folding the display device, the driving circuit chip 500 disposed on the virtual extension line of the folding axis Y may resist the folding to remain substantially flat and not actually be folded, and the stress generated upon folding the display device is concentrated on the FPC film 50 around the driving circuit chip 500 (as represented by the non-linear character at the folding axis Y below the driving circuit chip 500). Accordingly, the possibility that the driving circuit chip 500 is separated or disconnected from the FPC film 50 attached to the display panel 10 becomes relatively high.

In addition, dissimilar to FIG. 6, in the case where the driving circuit chip 500 is disposed apart from the folding axis Y of the FPC film 50 (e.g., not at the center of the FPC film 50), but the display panel 10 and the FPC film 50 still have no cut-out portion, the area of the display panel 10 at or between the pad portions adjacent with respect to the folding axis Y and to which the FPC film 50 is attached may be folded. For example, when the display panel 10 is folded along the folding axis Y, not only the area between the pad portions adjacent with respect to the folding axis Y, but also an area at the adjacent pad portions is subject to the stress.

In particular, the FPC film 50 and the bending area BA which is a portion of the display panel 10 are bent about the bending axis X and located on a back surface of the display panel 10 (refer to FIG. 2, for example). Accordingly, when the display panel 10 is folded along the folding axis Y, the display area DA of the display panel 10 may have a radius of bending different from each of the radius of bending of the bending area BA and the pad area PA of the display panel 10 and the FPC film 50. In such a case, the bending area BA of the display panel 10, the pad area PA of the display panel 10, and the FPC film 50 which is located on the back surface of the display panel 10 are folded in an unpredictable manner. Accordingly, a larger stress may be concentrated at the area of the adjacent pad portions, and at the FPC film 50 around the driving chip 500, and thus cracks and disconnection may occur in the wirings disposed at the pad area PA of the display panel 10 and the wirings disposed at the FPC film 50.

Referring to FIG. 7, the display panel according to one or more embodiment of the invention has defined therein the cut-out portion C lengthwise extended on the virtual extension line of the folding axis Y, in both the pad area PA and the bending area BA. The driving circuit chip 500 is attached on the FPC film 50 at a position not overlapping the virtual extension line of the folding axis Y.

When the display panel 10 is folded along the folding axis Y, the display area DA of the display panel 10 has a radius of bending different from the radius of bending of each of the bending area BA and the pad area PA of the display panel 10, and the FPC film 50. Accordingly, although the stress is concentrated in the area between the first pad portion PP1 and the second pad portion PP2, due to the cut-out portion C, the stress generated upon folding does not spread from the area between the first pad portion PP1 and the second pad portion PP2, to the first pad portion PP1, the second pad portion PP2 and the bending area BA. In addition, since the driving circuit chip 500 is disposed at a position not overlapping the virtual extension line of the folding axis Y the stress generated upon folding does not affect the driving circuit chip 500, and thus separation of the driving circuit chip 500 and the FPC film 50 from each other may be reduced or substantially prevented.

As such, the cut-out portion C may be defined in various shapes between the neighboring first and second pad portions PP1 and PP2 of the FPC film 50, and delivery of the folding effect (e.g., stress, force, etc.) at the first pad portion PP1 to the adjacent second pad portion PP2 is reduced or substantially prevented by the cut-out portion C, thereby reducing or substantially preventing damage to the wirings W in the bending area BA.

Hereinafter, a structure of the display device will be described in detail mainly with respect to the pixels PX of the display area DA and the non-display area NDA which includes the bending area BA and the pad area PA.

Figure 8:
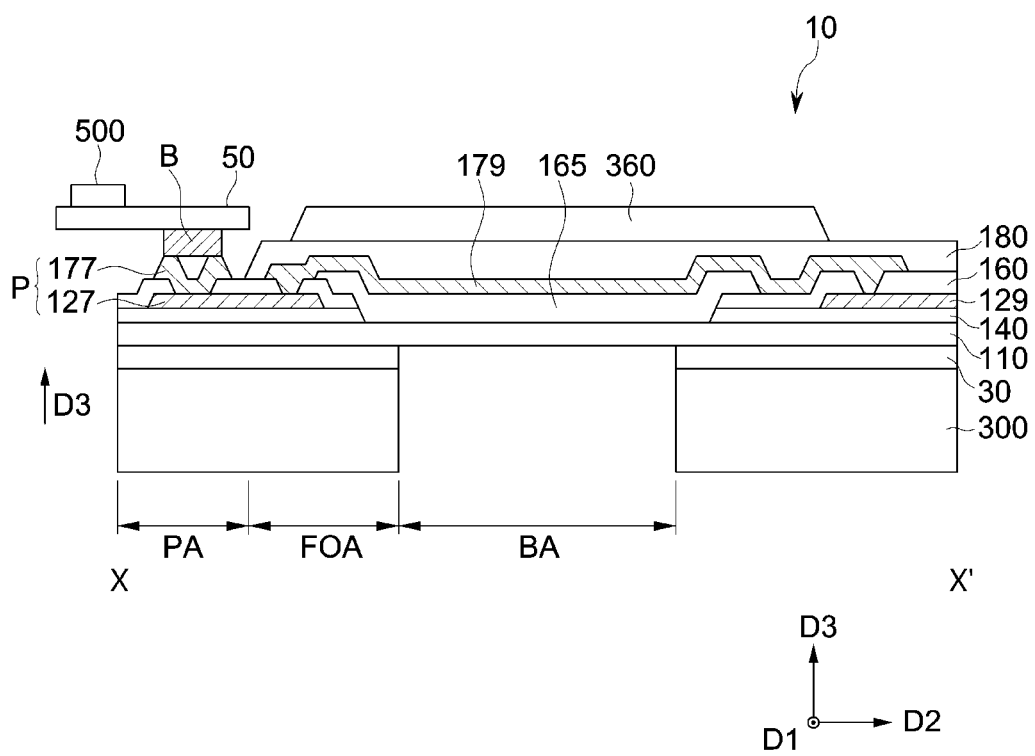
FIG. 8 is an embodiment of an enlarged cross-sectional view of the display device taken along line X-X' in FIG. 1 according to the invention.
Figure 9:
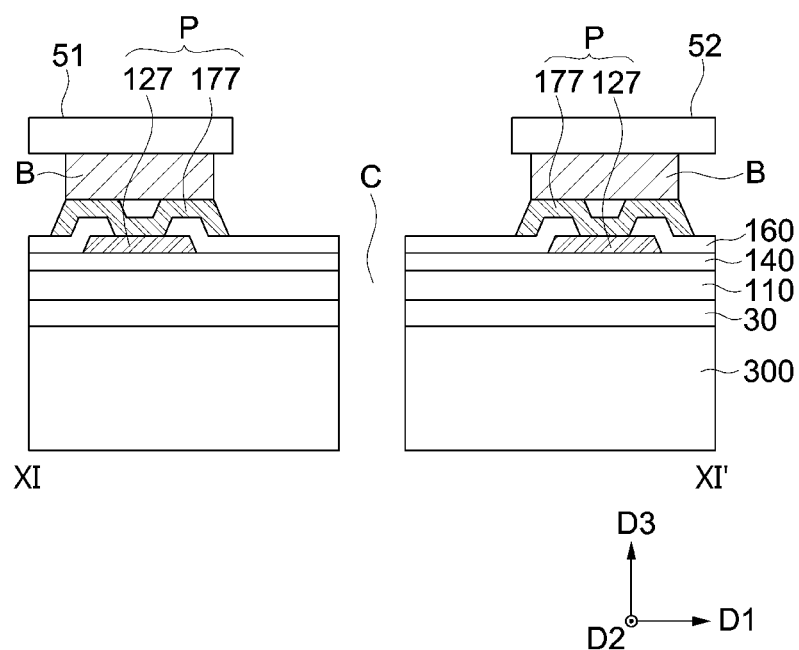
FIG. 9 is an embodiment of an enlarged cross-sectional view of the display device taken along line XI-XI' in FIG. 1 according to the invention.
Figure 10:
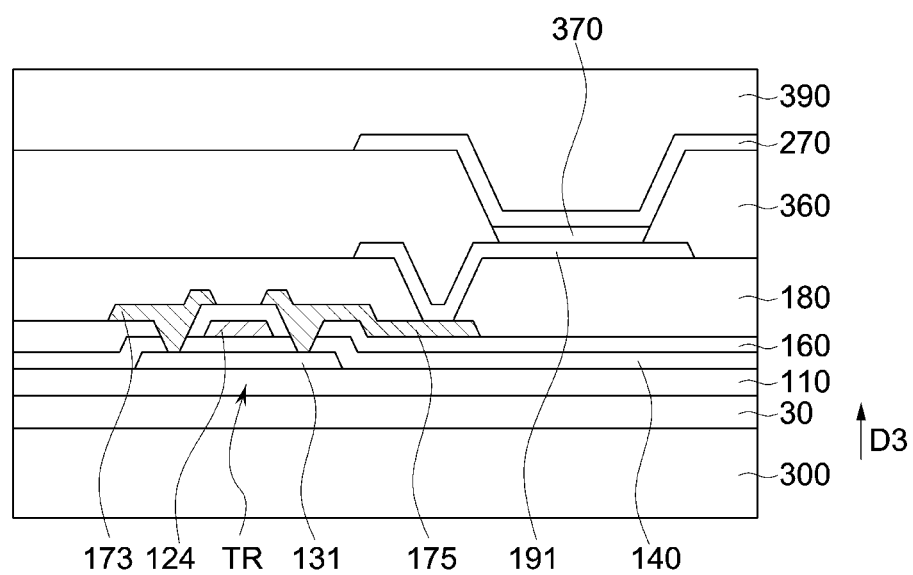
FIG. 10 is a cross-sectional view illustrating an embodiment of a pixel area of the display device of FIG. 1 according to the invention.
Figure 11:
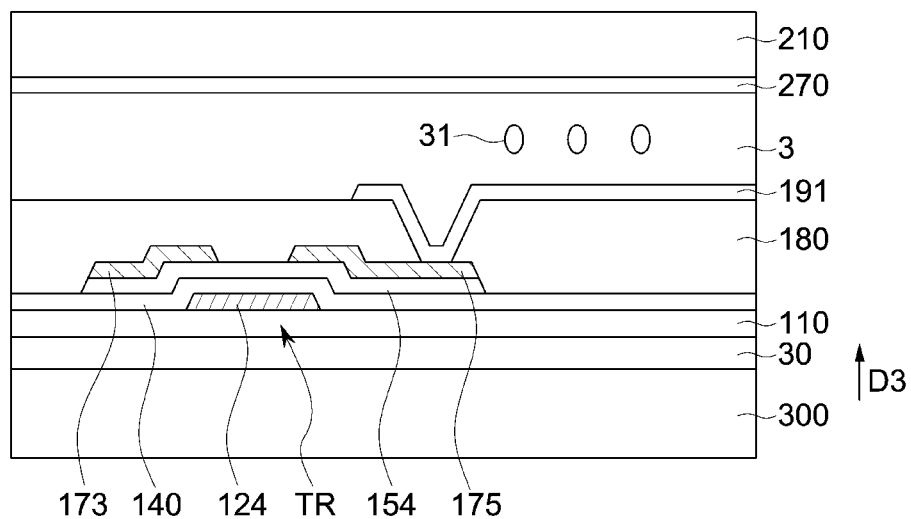
FIG. 11 is a cross-sectional view illustrating another embodiment of a pixel area of the display device of FIG. 1 according to the invention.

FIG. 8 is an embodiment of an enlarged cross-sectional view of the display device taken along line X-X' in FIG. 1 according to the invention, FIG. 9 is an embodiment of an enlarged cross-sectional view of the display device taken along line XI-XI' in FIG. 1 according to the invention, FIG. 10 is a cross-sectional view illustrating an embodiment of a pixel area of the display device of FIG. 1 according to the invention, and FIG. 11 is a cross-sectional view illustrating another embodiment of a pixel area of the display device of FIG. 1 according to the invention. The structures in FIG. 8 and FIG. 9 represent a pixel area PX of the display area DA (refer to FIG. 1). In FIG. 10 and FIG. 11, the horizontal direction may represent the first direction D1 and/or the second direction D2, without being limited thereto.

FIG. 10 is to describe the case where the display device is an OLED display device, and FIG. 11 is to describe the case where the display device is an LCD device. The structure of FIGS. 8 and 9 may be applied regardless of the type of display device, that is, to each of the display devices in FIG. 10 and FIG. 11. First, an OLED display device will be described with reference to FIGS. 8, 9 and 10, and the difference will be mainly described for the LCD devices.

Referring to FIGS. 8, 9 and 10, the display panel 10 includes a (base) substrate 110 and a plurality of layers which are disposed or formed on the substrate 110.

The substrate 110 may be a flexible substrate including or being formed of a transparent polymer film. In an embodiment, for example, the substrate 110 may include or be formed of plastic such as polyimide, polyamide or polyethylene terephthalate.

The substrate 110 may define an entirety of each of the display area DA and the non-display area NDA (refer to FIG. 1). As a flexible substrate, the substrate 110 may be foldable along the folding axis Y (refer to FIG. 1).

A buffer layer (not shown) may be disposed in the substrate 110 and/or on the substrate 110 to reduce or substantially prevent diffusion of impurities which may deteriorate the semiconductor characteristics and to reduce or substantially prevent infiltration of moisture or the like, to layers disposed on the base substrate 110. The buffer layer may be disposed or formed over the entire surface of the substrate 110, but may not be formed (e.g., is excluded) in the bending area BA.

A semiconductor 131 of a switching element used to drive the pixel area PX, such as a transistor TR, is located on the substrate 110, and a gate insulating layer 140 is located on the semiconductor 131. A same one of the semiconductor 131 includes a source area, a drain area, and a channel area between the source area and the drain area. The semiconductor 131 may include polycrystalline silicon, oxide semiconductor or amorphous silicon. In an exemplary embodiment of manufacturing a display device, the gate insulating layer 140 may be formed by laminating an inorganic insulating material such as silicon oxide or silicon nitride, on the substrate 110. The gate insulating layer 140 may not be located in the bending area BA. Dissimilar to the illustrated exemplary embodiment, the gate insulating layer 140 may be located only in the area overlapping a same gate conductor (layer) such as including a first pad layer 127 and a gate electrode 124 therein, and may not be located (e.g., is excluded) in the pad area PA.

The gate conductor including the first pad layer 127 of a (terminal) pad P, a first wiring portion 129 of the wiring W, and the gate electrode 124 of the transistor TR is located on the gate insulating layer 140. The gate conductor elements 127, 129 and 124 may be formed from a same material layer disposed on the substrate 110, so as to be disposed in a same layer of the display panel 10 among layers disposed on the substrate 110. In an exemplary embodiment of manufacturing a display device, the first pad layer 127, the first wiring portion 129 and the gate electrode 124 may be formed together by laminating a conductive material layer, such as copper (Cu), aluminum (Al), silver (Ag), molybdenum (Mo), chromium (Cr), tantalum (Ta), or titanium (Ti), or a combination of the aforementioned materials, on the substrate 110 and patterning a same one of the conductive material layer.

An insulating interlayer 160 is disposed on the first pad layer 127, the first wiring portion 129, and the gate electrode 124. The insulating interlayer 160 may include an inorganic material. The insulating interlayer 160 may not be located (e.g., is excluded) in the bending area BA.

A data conductor including a second pad layer 177 of the (terminal) pad P, a second wiring portion 179 of the wiring W, and a source electrode 173 and a drain electrode 175 of the transistor TR is located on the insulating interlayer 160. The second pad layer 177 overlaps the first pad layer 127 at the pad P, and is connected to the first pad layer 127 through and at a contact hole defined in the insulating interlayer 160. The second wiring portion 179 extending across the bending area BA is connected to an extension portion of the first pad layer 127 and to the first wiring portion 129 through and at contact holes defined in the insulating interlayer 160. The source electrode 173 and the drain electrode 175 are connected to a source area and a drain area of the semiconductor 131 through or at contact holes defined in the insulating interlayer 160 and the gate insulating layer 140, respectively.

The data conductor may include, for example, a metal material, such as copper (Cu), aluminum (Al), silver (Ag), molybdenum (Mo), chromium (Cr), gold (Au), platinum (Pt), palladium (Pd), tantalum (Ta), tungsten (W), titanium (Ti) or nickel (Ni), or a metal alloy, or a combination of the aforementioned materials. The data conductor may include or be formed of an aluminum-based metal such as aluminum or an aluminum alloy having a relatively low Young's modulus. In such an embodiment, since the second wiring portion 179 of the wiring W located in the bending area BA has a relatively small stress or force against strain (e.g., a change in shape or form), the risk of disconnection or deterioration may be reduced upon bending.

In the bending area BA, a protection layer 165 may be positioned between the substrate 110 and the second wiring portion 179 along a thickness direction (e.g., third direction D3) of the display device. The protection layer 165 may include an organic material. In an embodiment, the protection layer 165 is substantially omitted from the pad area PA, the fan-out area FOA, a remaining portion of the non-display area NDA, and the display area DA.

A passivation layer 180 is disposed on the second wiring portion 179, the source electrode 173 and the drain electrode 175.

The passivation layer 180 may include an organic material. The second wiring portion 179 may be sandwiched between the protection layer 165 and the passivation layer 180 in the bending area BA, such that damage to the second wiring portion 179 from bending thereof may be reduce or substantially prevented due to the protection layer 165 and the passivation layer 180. The passivation layer 180 may not be located in the pad area PA.

On the passivation layer 180, a pixel electrode 191 is disposed. The pixel electrode 191 may be connected to the drain electrode 175 through or at a contact hole defined in the passivation layer 180 to receive a data signal.

A pixel defining layer 360 is located on a portion of the passivation layer 180 and the pixel electrode 191. Portions of the pixel defining layer 360 define an opening therein which overlaps the pixel electrode 191. The opening of the pixel defining layer 360 may define a light emitting area of the display device, at which light is transmitted to display an image. In the opening of the pixel defining layer 360, a light emitting layer 370 is located on the pixel electrode 191, and a common electrode 270 is located on the light emitting layer 370. The pixel electrode 191, the light emitting layer 370 and the common electrode 270 together constitute an OLED.

The pixel electrode 191 may be an anode of the OLED, and the common electrode 270 may be a cathode of the OLED. The common electrode 270 may include a transparent conductive material such as indium tin oxide ("ITO") or indium zinc oxide ("IZO").

An encapsulation layer 390 for protecting the OLED is located on the common electrode 270. The encapsulation layer 390 may include at least one organic material layer and/or at least one inorganic material layer.

In an embodiment, the pixel defining layer 360 and the encapsulation layer 390 are not located at the pad portion PP so that the pad P may be exposed outside the display panel 10, such as for connection to an element external to the display panel 10. In another embodiment, referring to FIG. 8 and FIG. 10, the pixel defining layer 360 may be located in the bending area BA, but the encapsulation layer 390 may not be located in the bending area BA. A bending protection layer (not shown) for protecting the second wiring portion 179 of the wiring W and relieving a tensile stress applied thereto may be located on the pixel defining layer 360 in the bending area BA.

At the pad area of the FPC film 50 a bump B provided in plurality is located, such as to function as a pad for connection to the display panel 10. An anisotropic conductive film (not shown) including conductive particles is located between the pad P of the display panel 10 and the bump of the FPC film 50 to attach the FPC film 50 to the pad portion PP and to connect the pad P and the bump B in an electric manner.

A protective film 300 is disposed below the substrate 110. The protective film 300 is attached to the substrate 110 by an adhesive layer 30 such as a pressure sensitive adhesive ("PSA") or an optically clear adhesive ("OCA"). The protective film 300 is a polymer film, and may include or be formed of plastic such as polyethylene terephthalate, polyethylene naphthalate, polyethylene sulfide, polyethylene or polyimide. In order to reduce the bending stress of the bending area BA, the protective film 300 may not be located in the bending area BA as illustrated in FIG. 8 and FIG. 9.

Referring to FIG. 9, between neighboring pad portions (represented by the left bump B and the right bump B shown in FIG. 9 corresponding to the left pad P and the right pad P of the display panel 10), the cut-out portion C is defined extended partially or wholly through the display panel 10 in the third direction D3, which is the thickness direction of the display panel 10. Accordingly, the cut-out portion C is not only defined in the substrate 110 of the display panel, but also defined in the insulating layers 140 and 160 disposed or formed thereon and the protective film 300 attached therebelow. Furthermore, the cut-out portion C of the FPC film 50 is defined between the first and second pad portions (refer to PP1 and PP2 of FIG. 1, represented by the left pad P and the right pad P of FIG. 9)

Referring to FIG. 11, in relation to LCD devices, the gate electrode 124 of the transistor TR is located on the substrate 110, and the gate insulating layer 140 is located thereon. A semiconductor 154 of the transistor TR is located on the gate insulating layer 140, and the source electrode 173 and the drain electrode 175 of the transistor TR are located on the semiconductor 154. When the transistor TR has such a structure, the gate insulating layer 140 is located at the position where the insulating interlayer 160 is formed in FIG. 9, and the insulating interlayer 160 may be omitted.

The passivation layer 180 is disposed on the source electrode 173 and the drain electrode 175, and the pixel electrode 191 is disposed on the passivation layer 180. The pixel electrode 191 may be connected to the drain electrode 175 through or at a contact hole defined in the passivation layer 180 to receive the data signal.

An optical control layer such as a liquid crystal layer 3 including liquid crystal molecules 31 is located on the pixel electrode 191, and an insulating layer 210 sealing the liquid crystal layer 3 together with the substrate 110 is located on the liquid crystal layer 3. The insulating layer 210 may be in the form of a substrate.

The common electrode 270 for generating an electric field in the liquid crystal layer 3 to control the alignment direction of the liquid crystal molecules 31, along with the pixel electrode 191, is disposed below the insulating layer 210. An alignment layer (not shown) may be disposed between the pixel electrode 191 and the liquid crystal layer 3, and between the liquid crystal layer 3 and the common electrode 270. Dissimilar to the illustrated exemplary embodiment, the common electrode 270 and the pixel electrode 191 may both be located between the substrate 110 and the liquid crystal layer 3.

As set forth hereinabove, the display device according to one or more embodiments of the invention may provide the following effects.

According to one or more embodiment of the invention, a force applied to the conductive wirings disposed in the bending area in the direction different from the bending direction of the display device may be suppressed, and thus the occurrence of cracks in the conductive wirings of the bending area may be reduced or substantially prevented.

By using the cut-out portion in the display panel, when the display panel is folded, wrinkling of the display panel in an unpredictable manner due to a difference in bending radius of the display area as compared to the bending area, the pad area and the FPC film may be reduced or substantially prevented.

In addition, the stress force generated by bending of the display device does not affect the driving circuit chip of the FPC film, and thus separation of the driving circuit chip and the flexible circuit film from each other may be reduced or substantially prevented.

While the invention has been illustrated and described with reference to the embodiments thereof, it will be apparent to those of ordinary skill in the art that various changes in form and detail may be made thereto without departing from the spirit and scope of the invention.

What is claimed is:

1. A display device comprising:
    a display panel which receives a signal to display an image, the display panel comprising:
        a substrate foldable about a folding axis of the display device, and
        a pad portion which is on the substrate, at which the signal is provided to the display panel from outside thereof, the pad portion provided in plurality comprising a first pad portion and a second pad portion respectively disposed at opposing sides of the folding axis; and
    a flexible printed circuit film through which the signal is provided to the display panel from the outside thereof, the flexible printed circuit film commonly attached to the first pad portion and the second pad portion of the display panel to overlap an edge of the display panel,
    wherein the flexible printed circuit film which overlaps the edge of the display panel defines a cut-out portion of the flexible printed circuit film which is located on an extension line of the folding axis of the display device.

2. The display device of claim 1, wherein
    the flexible printed circuit film comprises a pad area at which the flexible printed circuit film is attached to the pad portion of the display panel, and
    the display panel defines a cut-out portion thereof located on the extension line of the folding axis of the display device, the cut-out portion of the display panel overlapping the cut-out portion of the flexible printed circuit film at the pad area thereof.

3. The display device of claim 2, wherein from the pad area at which the cut-out portions of the display panel and the flexible printed circuit film overlap each other,
    the cut-out portion of the display panel extends further than an edge of the flexible printed circuit film to dispose a portion of the cut-out portion of the display panel non-overlapping with the flexible printed circuit film, and
    the cut-out portion of the flexible printed circuit film extends further than the edge of the display panel to dispose a portion of the cut-out portion of the flexible printed circuit film non-overlapping with the display panel.

4. The display device of claim 1, further comprising a driving circuit chip which provides the signal to the flexible printed circuit film, mounted on the flexible printed circuit film which overlaps the edge of the display panel,
    wherein the flexible printed circuit film which overlaps the edge of the display panel comprises:
        a first flexible printed circuit portion which overlaps the edge of the display panel, the first flexible printed circuit portion comprising wiring connecting the driving circuit chip to the first pad portion of the display panel;
        a second flexible printed circuit portion which overlaps the edge of the display panel, the second flexible printed circuit portion comprising wiring connecting the driving circuit chip to the second pad portion of the display panel; and
        a connection portion connecting the first flexible printed circuit portion and the second flexible printed circuit portion to each other,
    wherein the cut-out portion of the flexible printed circuit film is defined by the connection portion of the flexible printed circuit film together with the first flexible printed circuit portion and the second flexible printed circuit portion of the flexible printed circuit film.

5. The display device of claim 1, wherein
    the display panel further comprises:
        a display area at which the image is displayed, and
        a non-display area which is adjacent to the display area and at which the image is not displayed,
    in the non-display area, the first pad portion and second pad portion of the display panel are respectively disposed at the opposing sides of the folding axis of the display device, and
    the cut-out portion of the flexible printed circuit film lengthwise extends between the first pad portion and the second pad portion of the display panel in the non-display area, along the extension line of the folding axis of the display device.

6. The display device of claim 2, wherein
    the display panel further comprises a bending area at which the display panel is bendable along a bending axis intersecting the folding axis of the display device, and
    along a length of the folding axis, the bending area of the display panel is respectively positioned between the display area and each of the first and second pad portions.

7. The display device of claim 6, wherein along the length of the folding axis, a length of the cut-out portion of the display panel extends from the pad portion and into the bending area.

8. The display device of claim 6, wherein
    the display panel further comprises:
        along the length of the folding axis, a fan-out portion between the bending area and the pad portion, the fan-out portion provided in plurality comprising a first fan-out portion and a second fan-out portion respectively disposed at the opposing sides of the folding axis, and
        wirings on the substrate, extended from the display area and through the fan-out area to the pad portion, and through which the signal is provided to the display area from the pad portion, an interval between the wirings of the display panel in the fan-out portion is smaller than that in the bending area, and a length of the cut-out portion of the display panel extends along the length of the folding axis to be disposed between the first fan-out portion and the second fan-out portion.

9. The display device of claim 2, wherein along a length of the folding axis of the display device, an end portion of the cut-out portion of the display panel is disposed furthest from the flexible printed circuit film, and the end portion has a planar shape among a wedge shape, a polygonal shape, a circular shape and an elliptical shape.

10. The display device of claim 2, wherein the cut-out portion of the display panel and the cut-out portion of the flexible printed circuit film are defined extended through a thickness of the display panel and a thickness of the flexible printed circuit film, respectively.

11. The display device of claim 1, further comprising a polarizing plate disposed on the display panel, wherein the polarizing plate defines a cut-out portion overlapping the cut-out portion of the flexible printed circuit film.

12. A display device comprising:

a display panel which receives a signal to display an image, the display panel comprising:

a substrate foldable about a folding axis of the display device, and a pad portion which is on the substrate, at which the signal is provided to the display panel from outside thereof, the pad portion provided in plurality comprising a first pad portion and a second pad portion respectively disposed at opposing sides of the folding axis;

a flexible printed circuit film through which the signal is provided to the display panel from the outside thereof, the flexible printed circuit film commonly attached to the first pad portion and the second pad portion of the display panel to overlap an edge of the display panel; and a driving circuit chip which provides the signal to the flexible printed circuit film, mounted on the flexible printed circuit film which overlaps the edge of the display panel, wherein the flexible printed circuit film which overlaps the edge of the display panel includes a central portion corresponding to an extension line of the folding axis of the display device, and the driving circuit chip is disposed apart from the central portion of the flexible printed circuit film.

13. The display device of claim 12, wherein the driving circuit chip mounted on the flexible printed circuit film which overlaps the edge of the display panel, does not overlap the folding axis of the display device.

14. The display device of claim 12, wherein at least one of the substrate and the flexible printed circuit film defines a cut-out portion located on the extension line of the folding axis of the display device.

15. The display device of claim 14, wherein the flexible printed circuit film which overlaps the edge of the display panel comprises:

the cut-out portion located on the extension line of the folding axis of the display device;

a first flexible printed circuit portion comprising wiring connecting the driving circuit chip to the first pad portion of the display panel;

a second flexible printed circuit portion comprising wiring connecting the driving circuit chip to the second pad portion of the display panel; and a connection portion connecting the first flexible printed circuit portion and the second flexible printed circuit portion to each other, wherein the cut-out portion of the flexible printed circuit film is defined by the connection portion of the flexible printed circuit film together with the first flexible printed circuit portion and the second flexible printed circuit portion of the flexible printed circuit film.

16. The display device of claim 15, wherein the driving circuit chip is mounted on one flexible printed circuit portion among the first flexible printed circuit portion and the second flexible printed circuit portion to be disposed apart from the central portion of the flexible printed circuit film.

17. The display device of claim 16, wherein among the first and second flexible printed circuit portions, a width of the wiring of the one flexible printed circuit portion on which the driving circuit chip mounted is smaller than a width of the wiring of the other flexible printed circuit portion.

18. The display device of claim 16, wherein the wiring of the one flexible printed circuit portion on which the driving circuit chip mounted has a zigzag shape.

19. The display device of claim 15, wherein the connection portion of the flexible printed circuit film comprises wirings connected to one of the first pad portion and the second pad portion of the display panel, and the wirings of the connection portion are disposed in different layers of the flexible printed circuit film at the connection portion thereof, to overlap each other.

20. The display device of claim 14, wherein the display panel further comprises a bending area at which the display panel is bendable along a bending axis intersecting the folding axis of the display device, and along a length of the folding axis, the bending area of the display panel is respectively between the display area and each of the first and second pad portions.

21. The display device of claim 20, wherein the display panel comprises the cut-out portion located on the extension line of the folding axis of the display device, and the cut-out portion of the display panel extends from the pad portion and into the bending area.

22. The display device of claim 14, further comprising a polarizing plate disposed on the display panel, wherein the display panel comprises the cut-out portion located on the extension line of the folding axis of the display device, and the polarizing plate defines a cut-out portion overlapping the cut-out portion of the display panel.

* * * * *